United States Patent
Müller et al.

(10) Patent No.: US 9,785,728 B2
(45) Date of Patent: *Oct. 10, 2017

(54) COMPUTER SYSTEM AND METHOD FOR GENERATING A 3D GEOMETRIC MODEL

(71) Applicant: Environmental Systems Research Institute, Inc., Redlands, CA (US)

(72) Inventors: Pascal Müller, Zürich (CH); Gang Zeng, Zürich (CH); Luc Van Gool, Antwerp (BE)

(73) Assignee: Environmental Systems Research Institute, Inc., Redlands, CA (US)

(*) Notice: Subject to any disclaimer, the term of this patent is extended or adjusted under 35 U.S.C. 154(b) by 278 days.

This patent is subject to a terminal disclaimer.

(21) Appl. No.: 14/634,622

(22) Filed: Feb. 27, 2015

(65) Prior Publication Data

US 2015/0324496 A1    Nov. 12, 2015

Related U.S. Application Data

(63) Continuation of application No. 12/671,014, filed as application No. PCT/CH2008/000326 on Jul. 22, 2008, now Pat. No. 8,790,579.

(Continued)

(51) Int. Cl.
*G06T 17/00* (2006.01)
*G06F 17/50* (2006.01)
(Continued)

(52) U.S. Cl.
CPC ....... *G06F 17/5004* (2013.01); *G06K 9/4604* (2013.01); *G06T 17/005* (2013.01); *G06T 17/10* (2013.01)

(58) Field of Classification Search
CPC .................................. G06T 17/10; G06K 9/46
(Continued)

(56) References Cited

U.S. PATENT DOCUMENTS 8,970,579 B2    3/2015   Muller et al.

FOREIGN PATENT DOCUMENTS

| WO | WO 2007/027847 A2 | 3/2007 |
| WO | WO 2007/045272 A1 | 4/2007 |
| WO | WO 2008/044913 A1 | 4/2008 |

OTHER PUBLICATIONS

A.R. Dick et al., "Modelling and Interpretation of Architecture from Several Images," International Journal of Computer Vision 60(2), pp. 111-134, Nov. 1, 2004.

(Continued)

*Primary Examiner* — Weiming He
(74) *Attorney, Agent, or Firm* — Knobbe Martens Olson & Bear LLP

(57) ABSTRACT

For generating a 3D geometric model (44) and/or a definition of the 3D geometric model from a single digital image of a building facade (4), a facade structure is detected from the digital image by dividing the facade (4) along horizontal lines into horizontal layers representative of floors (41), and by dividing the horizontal layers along vertical lines into tiles (42). The tiles (42) are further subdivided into a hierarchy of rectangular image regions (43). 3D architectural objects (45) corresponding to the image regions (43) are determined in an architectural element library. The 3D geometric model (44) or the definition of the 3D geometric model is generated based on the facade structure, the hierarchy and the 3D architectural objects (45). The library-based generation of the 3D geometric model makes it possible to enhance simple textured building models constructed from aerial images and/or ground-based photographs.

7 Claims, 12 Drawing Sheets

Related U.S. Application Data

(60) Provisional application No. 60/962,187, filed on Jul. 27, 2007.

(51) Int. Cl.
*G06K 9/46* (2006.01)
*G06T 17/10* (2006.01)

(58) Field of Classification Search
USPC .................................... 345/419, 420, 619
See application file for complete search history.

(56) References Cited

OTHER PUBLICATIONS

Nora Ripperda et al., "Reconstruction of Façade Structures Using a Formal Grammar and RjMCMC," Pattern Recognition Lecture Notes in Computer Science; LNCS, Springer, Berlin, DE, vol. 4174, pp. 750-759, Jan. 1, 2006.
Peter Wonka et al., "Instant Architecture," ACM Transactions on Graphics, ACM, US, vol. 22, No. 3, pp. 669-677 Jul. 27, 2003.
International Search Report mailed Oct. 7, 2008.

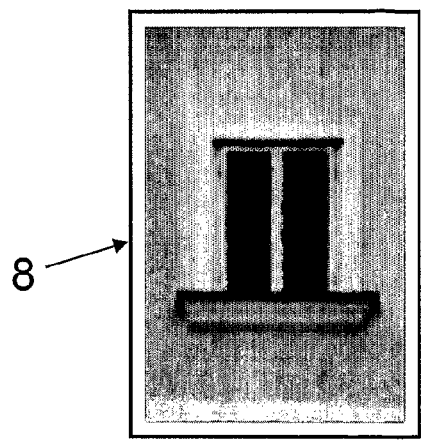
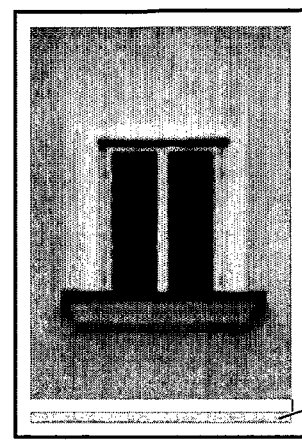
Fig. 8a     Fig. 8b
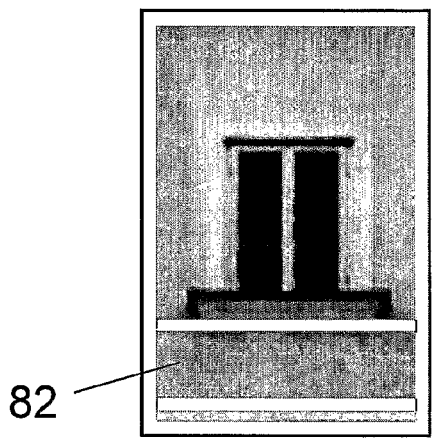
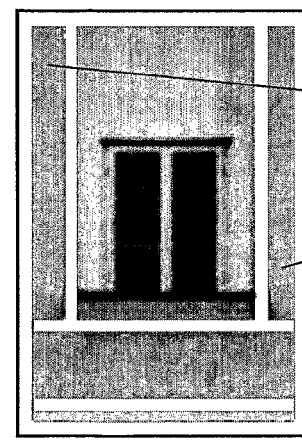
Fig. 8c     Fig. 8d
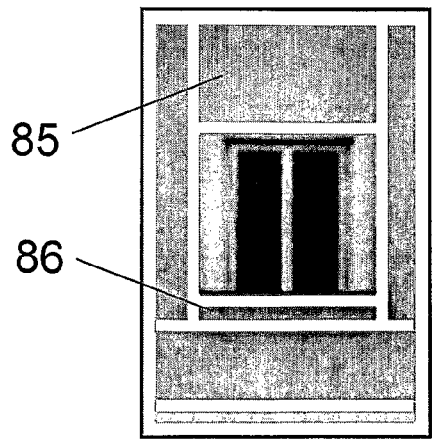
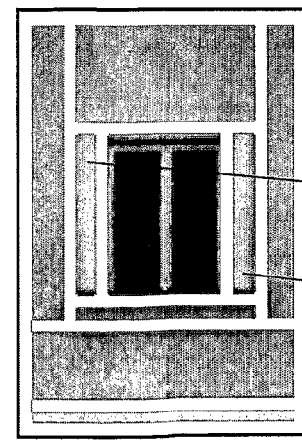
Fig. 8e     Fig. 8f

COMPUTER SYSTEM AND METHOD FOR GENERATING A 3D GEOMETRIC MODEL

FIELD OF THE INVENTION

The present invention relates to a computer system and a computer-implemented method for generating a 3D (three dimensional) geometric model. Specifically, the present invention relates to a computer system and a computer-implemented method for generating a 3D geometric model and/or a definition of the 3D geometric model from a single digital image of a building facade.

BACKGROUND OF THE INVENTION

With the availability of geographical information and associated aerial image information on the Internet, there has been an increased demand for 3D geometric models which enable users to navigate near ground level through metropolitan areas, for example. However, while current systems provide stunning images from a bird's eye view, the resolution of geometry and texture is not sufficient for important applications in which a user navigates near ground level. For example, a virtual training application for emergency response will require interaction with a detailed model of high visual quality and realism, including semantic information for meaningful simulation. Other applications in the entertainment industry, urban planning, visual impact analysis, driving simulation, and military simulation have similar requirements. Thus, for providing 3D geometric models at a large scale, i.e. for an extensive geographical area, and with sufficient quality for practical applications, required are efficient mechanisms for urban reconstruction based on low resolution oblique aerial imagery and, in particular, reconstruction of facades based on higher resolution ground-based imagery. While computer graphics techniques meet the quality criteria of most applications, the conventional methods of large-scale reconstruction require several man years of labor. Although, recent techniques in computer graphics focus on efficient large-scale modeling, they do not provide a sufficient resemblance to the real life environment, and they do not support urban reconstruction from single facade images.

Urban reconstruction algorithms using ground-based facade images have been proposed by DEBEVEC, P. E., TAYLOR, C. J., AND MALIK, J., 1996, "Modeling and rendering architecture from photographs: A hybrid geometry- and image-based approach", Proceedings of ACM SIGGRAPH 96, ACM Press, H. Rushmeier, Ed., 11-20; JEPSON, W., LIGGETT, R., AND FRIEDMAN, S., 1996, "Virtual modeling of urban environments," PRESENCE 5, 1, 72-86; DICK, A., TORR, P., RUFFLE, S., AND CIPOLLA, R., 2001, "Combining single view recognition and multiple view stereo for architectural scenes," ICCV, IEEE Computer Society, Los Alamitos, Calif., 268-274; WANG, X., TOTARO, S., TAILLANDIER, F., HANSON, A., AND TELLER, S., 2002, "Recovering facade texture and microstructure from real-world images", Proc. ISPRS Commission III Symposium on Photogrammetric Computer Vision, 381-386, 2002; LEE, S. C., JUNG, S. K., AND NEVATIA, R., 2002, "Automatic integration of facade textures into 3D building models with a projective geometry based line clustering", Computer Graphics Forum 21, 3 (September), 511-519; and REALVIZ, 2007, "Realviz ImageModeler V4.0, product information", http://www.realviz.com. Generally, in these systems, a user is assisted by computer vision methods (e.g. Debevec et al. 1996) during modeling, while most automatic processes rely on graphical simplifications, limit the appearance of facade elements to pre-specified types, or rely fully on the detection and analysis of edges, which limits the detection of windows, for example, in otherwise homogeneous facades.

SUMMARY OF THE INVENTION

It is an object of this invention to provide a computer system and a computer-implemented method for generating a 3D geometric model and/or a definition of the 3D geometric model from a single digital image of a building facade, which system and method overcome at least some of the disadvantages of the prior art. In particular, it is an object of the present invention to provide a computer system and a computer-implemented method for generating efficiently a 3D geometric model and/or a definition of the 3D geometric model from an oblique aerial image with low resolution, or from a ground-based image with comparatively higher resolution. It is particularly a further object of the present invention to propose a computer-implemented method and a computer system for generating from a single digital image a 3D geometric model which has a significantly higher resolution and visual quality than the original single image.

According to the present invention, these objects are achieved particularly through the features of the independent claims. In addition, further advantageous embodiments follow from the dependent claims and the description.

According to the present invention, the above-mentioned objects are particularly achieved in that for generating a 3D geometric model and/or a definition of the 3D geometric model from a single digital image of a building facade, the digital image is subdivided into image regions, determined in an architectural element library 3D are architectural objects corresponding to the image regions, and the 3D geometric model or the definition of the 3D geometric model is generated based on the determined 3D architectural objects. Preferably, the definition of the 3D geometric model is a rules-based definition, particularly a rules-based parametric definition. Subdividing the digital image into image regions and assigning corresponding 3D architectural objects to the image regions makes it possible to generate automatically and efficiently a 3D geometric model with a higher resolution and visual quality than the aerial or ground-based input image. Thus, the proposed method makes it possible to enhance simple textured building mass models constructed from aerial images and/or ground-based photographs, for urban reconstruction and/or simulation applications, in which a user navigates virtually near ground level, for example a virtual training application for emergency response, applications in the entertainment industry, in urban planning, for visual impact analysis, for driving and/or military simulation, which require interaction with a detailed model of high visual quality and realism, including semantic information for meaningful simulation.

In a preferred embodiment, the digital image is subdivided into image regions by first detecting a facade structure from the digital image. The facade structure is detected by dividing the facade along horizontal lines into horizontal layers representative of floors, and by dividing the horizontal layers along vertical lines into tiles. Preferably, the tiles are representative in each case of an architectural building element and its surrounding wall. Subsequently, the tiles are subdivided into a hierarchy of rectangular image regions. Finally, the 3D geometric model or the definition of the 3D geometric model is generated based on the facade structure, the hierarchy of image regions, and the 3D architectural objects associated with the image regions. This bottom-down detection of the facade structure and its association with 3D architectural objects from a library make possible an efficient and flexible (architectural) grammar based modeling which incorporates (architectural) semantic information into the model. Furthermore, the detection of the facade structure and identification of the architectural elements make it possible to derive automatically exact dimensions, ratios and spacing of architectural elements.

Preferably, the detection of the facade structure includes determining similar horizontal layers by detecting vertical symmetry in a vertical direction, determining similar vertical columns by detecting horizontal symmetry in a horizontal direction, generating an irreducible facade structure with horizontal layers reduced to non-similar horizontal layers by stacking up the similar horizontal layers, and with vertical columns reduced to non-similar columns by stacking up the similar columns, and determining in the irreducible facade structure horizontal splitting lines which divide the facade into the floors, and vertical splitting lines which divide the facade into the tiles. Thus, the irreducible facade defines clusters ("stacks") of similar tiles. Preferably, subdividing the tiles into the hierarchy of rectangular image regions includes aligning horizontal splits within horizontal rows of tiles, and aligning vertical splits within vertical columns of tiles, based on information about horizontal and vertical repetition of similar tiles included in the irreducible facade structure, i.e. based on the clusters of similar tiles defined by the irreducible facade. Thus, the detection of translational symmetry not only improves the robustness of the algorithm, but also ensures that similar elements are split at corresponding positions.

In an embodiment, determining the 3D architectural objects comprises generating a 2D (two dimensional) representation of the 3D architectural objects included in the architectural element library, determining clusters of similar image regions, and determining in each case the 2D representation having a best match with the image regions of a cluster.

In a further embodiment, generating the 3D geometric model and/or the definition of the 3D geometric model is further based on shader information associated with the 3D architectural objects. Thus, the 3D geometric model not only has an improved resolution and visual quality but also an increased perceivable visual realism, as material attributes such as light reflection qualities are considered in generating the model.

In addition to the computer system and the computer-implemented method for generating a 3D geometric model and/or a definition of the 3D geometric model, the present invention also relates to a computer program product comprising computer program code means for controlling one or more processors of a computer such that the computer generates a 3D geometric model and/or a definition of the 3D geometric model from a single digital image of a building facade. Preferably the computer program product comprises a computer-readable medium containing the computer program code means therein.

Furthermore, the present invention relates to a data structure defining a 3D geometric model of a building facade for a computerized graphics generator. Preferably, the data structure provides a rules-based definition, particularly a rules-based parametric definition, of the 3D geometric model. The data structure comprises a first data element, indicating information about an order of floors and a number of repetitions of a respective floor, a floor being representative of a horizontal layer of the building facade. The data structure further comprises one or more second data elements, indicating in each case for one of the floors an order of tiles and a number of repetitions of a respective tile, a tile being representative of a segment of a floor with the full height of the floor. The data structure also comprises one or more third data elements, indicating in each case for one of the tiles a partial region of the respective tile, and one or more fourth data elements, indicating in each case for one of the partial regions a 3D architectural object for rendering by the computerized graphics generator.

BRIEF DESCRIPTION OF THE DRAWINGS

The present invention will be explained in more detail, by way of example, with reference to the drawings in which:

FIGS. 8a-8f: show different stages of determining image areas of a tile.

DETAILED DESCRIPTION OF THE PREFERRED EMBODIMENTS

Figure 1:
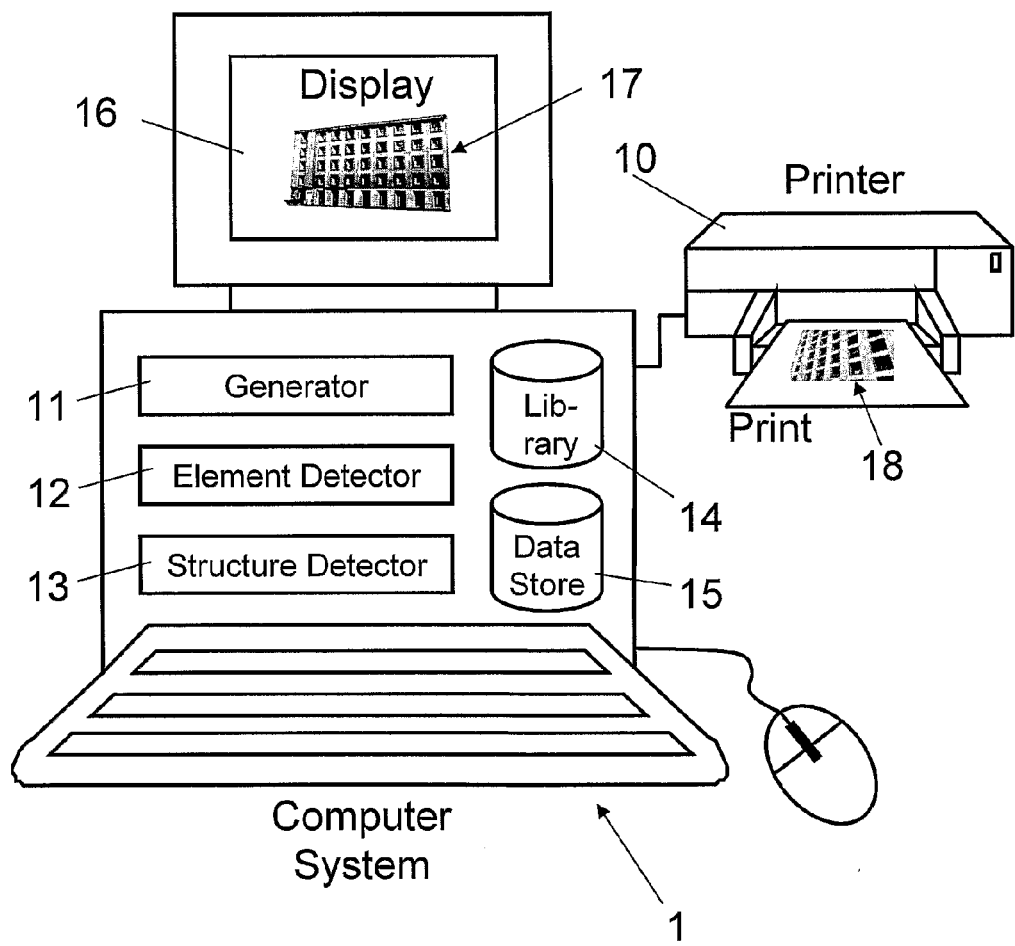
FIG. 1: shows a block diagram illustrating schematically a computer system for generating a 3D geometric model and/or a definition of the 3D geometric model from a single digital image of a building facade.

In FIG. 1, reference numeral 1 refers to a fully operational computer comprising data/program memory, at least one processor for executing programs loaded in the program memory, a display 16 for showing data input/output, operating elements for data entry, e.g. a keyboard and a computer mouse, and optionally a printer 10. As illustrated schematically in FIG. 1, the computer system 1 further comprises various functional modules including a generator 11, an element detector 12, and a structure detector 13, as well as an architectural element library 14 and a further data store 15. Preferably, the functional modules are implemented as programmed software modules; however, one skilled in the art will understand that the functional modules can also be implemented fully or partly by means of hardware elements. The programmed software modules are included in a computer program product which is stored on a computer readable medium connected in a fixed fashion or removably with the computer system 1.

Figure 9:
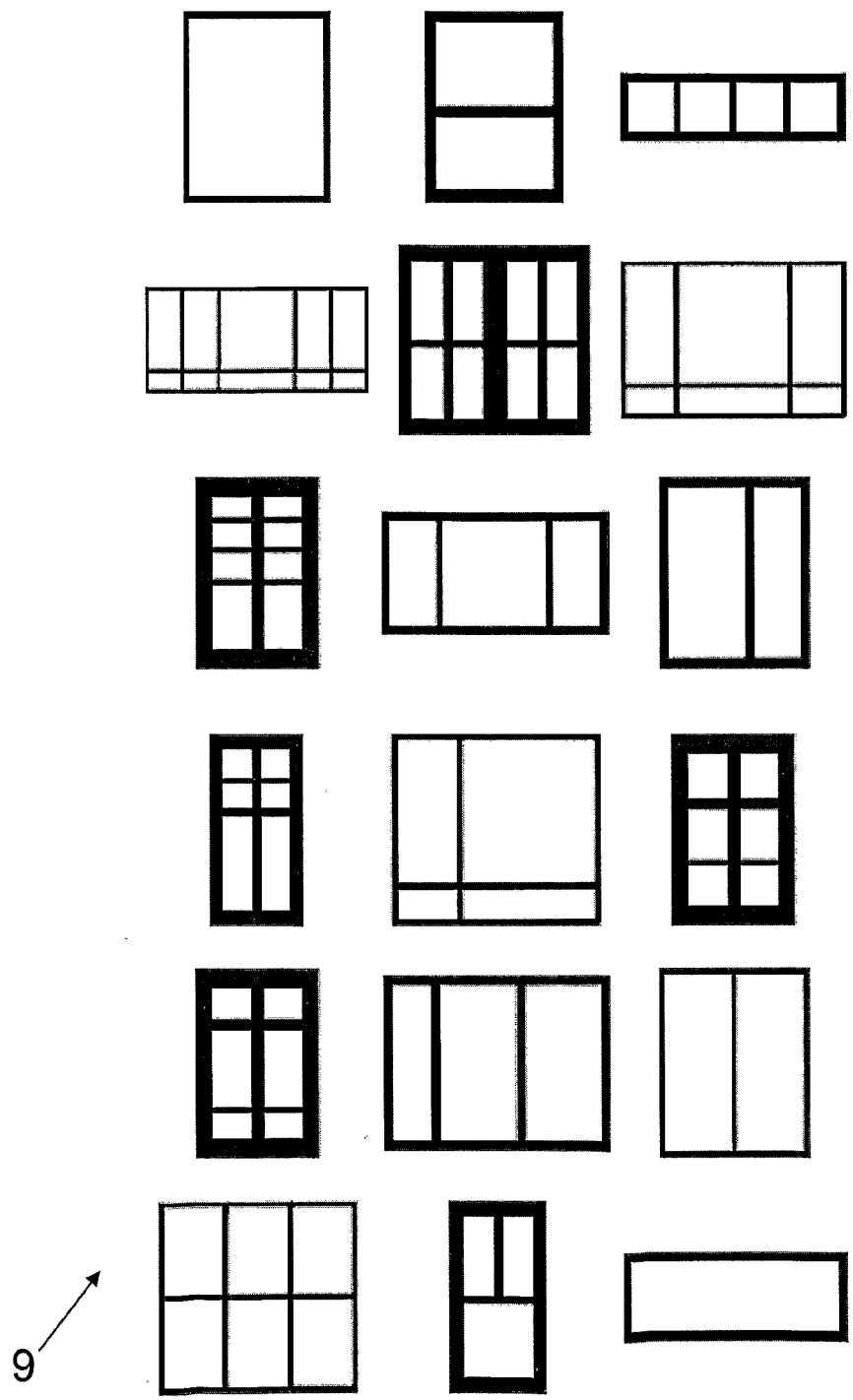
FIG. 9: shows example of 2D representations of 3D architectural objects from an architectural element library.

The architectural element library 14 includes 3D architectural objects, e.g. 3D polygonal models of architectural objects such as different types and styles of windows 9, as illustrated in FIG. 9, window sills, doors, door frames, balconies, etc. In an embodiment, the 3D architectural objects further include different types and styles of walls and/or wall elements. Preferably, the element library 14 further includes shader information assigned to the 3D architectural objects, e.g. material attributes such as a reflecting quality of glass. In an embodiment, a 2D representation is stored for each 3D architectural object in the library 14. Alternatively, the 2D representations are determined at run-time. For example, the 2D representations are computed as fronto-parallel projections.

Figure 2:
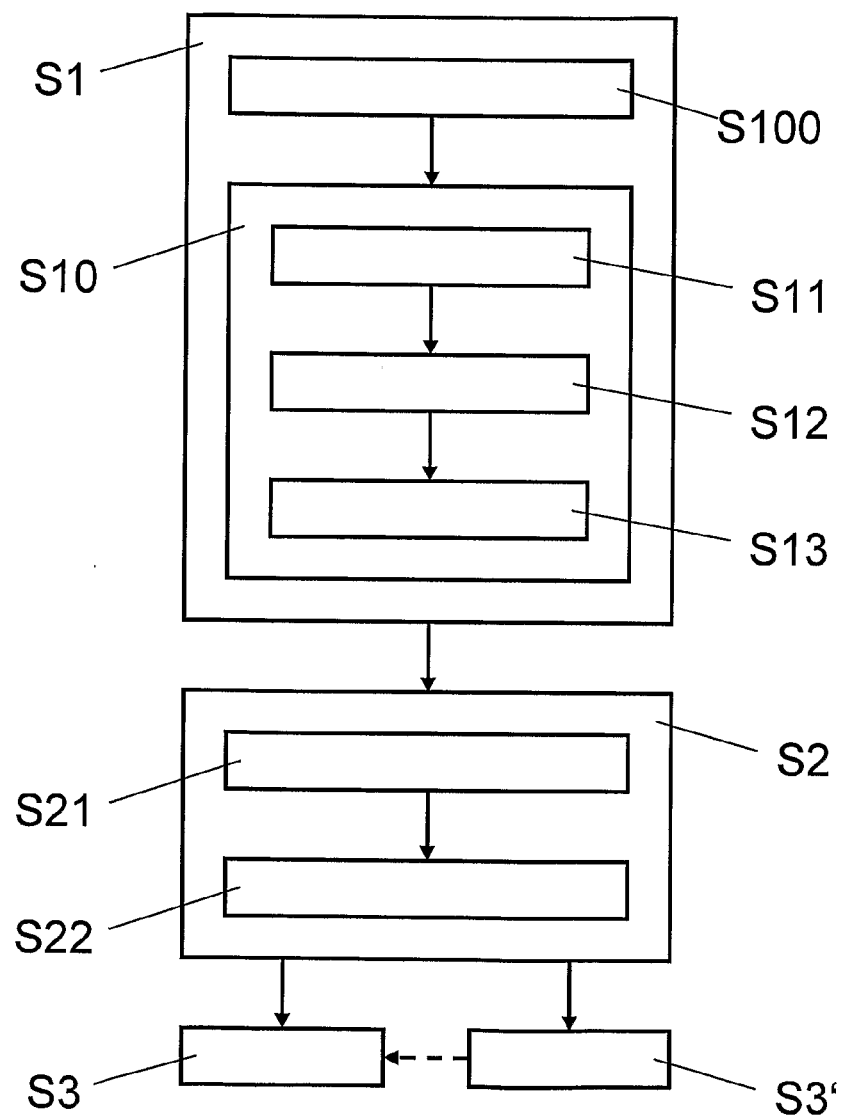
FIG. 2: shows a flow diagram illustrating an exemplary sequence of steps for generating the 3D geometric model and/or the definition of the 3D geometric mode from the digital image.
Figure 3:
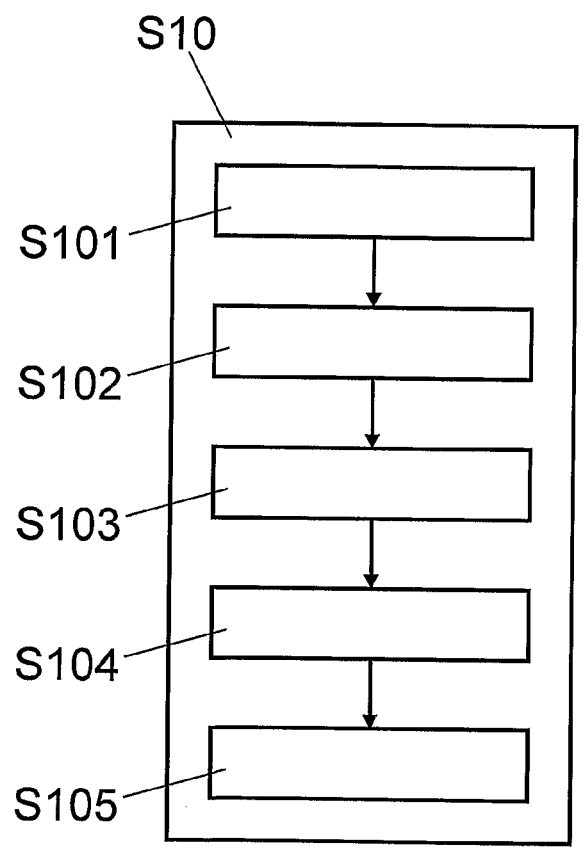
FIG. 3: shows a flow diagram illustrating an exemplary sequence of steps for detecting a facade structure from the digital image.
Figure 5A:
FIG. 5a: shows an example of a digital image of a building facade.
Figure 6A:
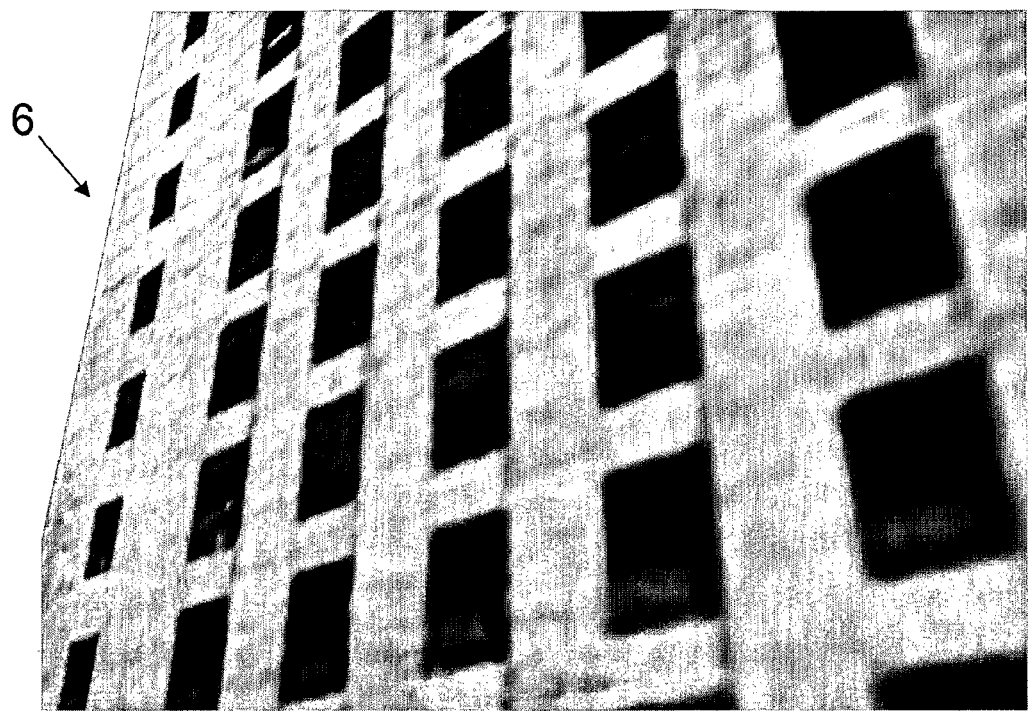
FIG. 6a: shows an example of a section a digital image of a building facade.

In the following paragraphs, described with reference to FIGS. 2 and 3 are possible sequences of steps for generating a 3D geometric model or a definition of the 3D geometric model from a digital image 5, 6 of a building facade, as illustrated in FIGS. 5a and 6a, for example.

Figure 4:
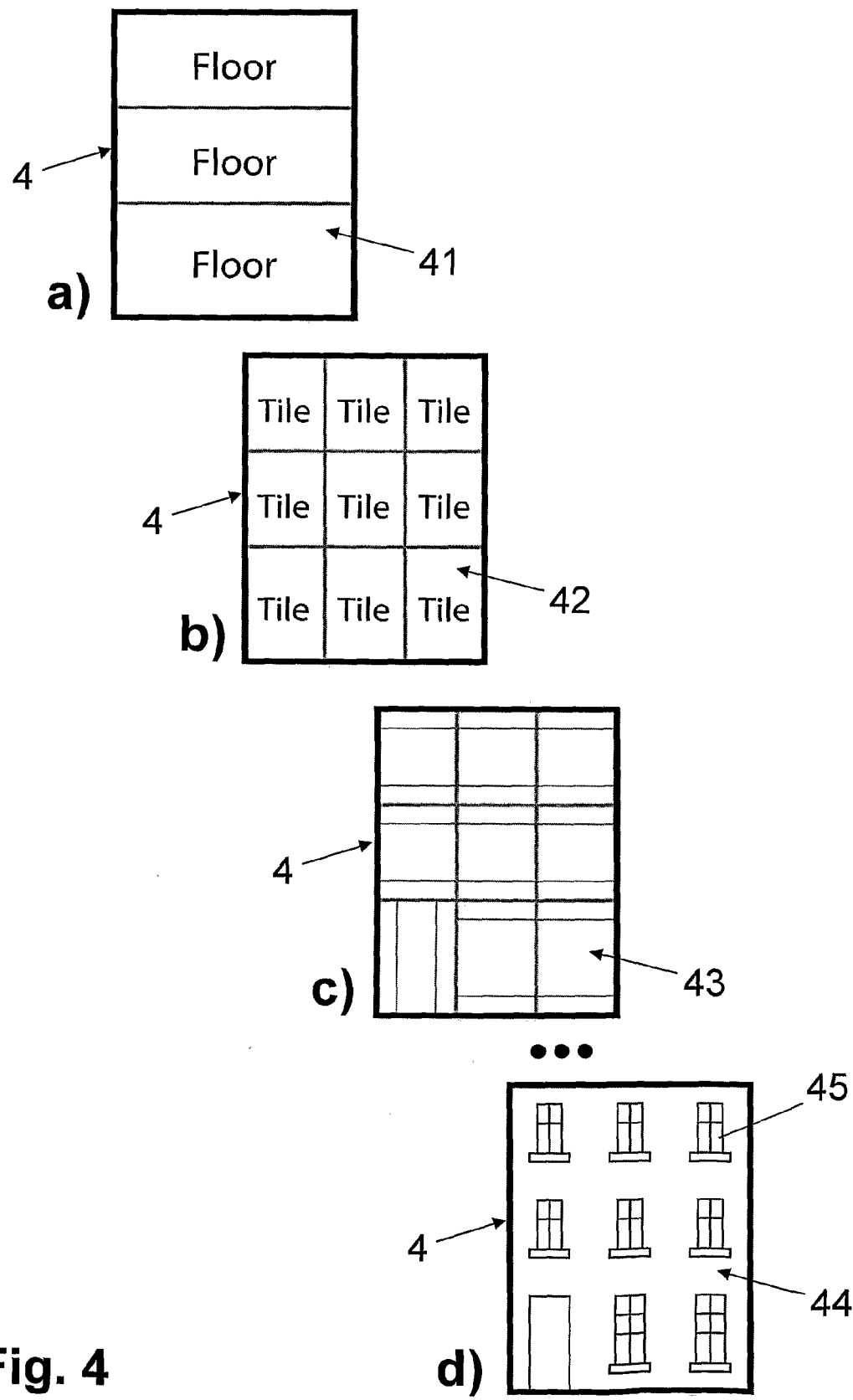
FIG. 4 (a-d): shows different stages of detecting the facade structure which includes floors and tiles.

As illustrated in FIG. 2, in step S1, the structure detector 13 subdivides the digital image 5, 6 into image regions 43, 81-88, shown, for example, in FIG. 4c), or 8b-8f, respectively. Preferably, the image regions are representative of architectural elements and/or wall elements surrounding these architectural elements.

In preparatory step S100, the structure detector 13 ensures that the digital image 5, 6 to be processed is in rectified form. If necessary, the structure detector 13 rectifies the digital image 5, 6, for example based on a variant of the algorithm proposed by LIEBOWITZ, D., and ZISSERMAN, A. 1998, "Metric rectification for perspective images of planes," CVPR, IEEE Computer Society, 482-488. First, the gradient operator is computed for each pixel in the image. The argument and magnitude of the resulting gradient vector indicate the orientation and reliability of a local edge respectively. Then, the Hough linear transformation is applied on these potential edges. Since lines are mapped into points in the Hough space, the reliable lines have strong corresponding points and a set of lines can be automatically extracted. Finally, two vanishing points are extracted by the RANSAC optimization based on these lines. The 2D projective transformation that transfers these two vanishing points into infinite points can finally be used to rectify the input image.

In step S10, the structure detector 13 detects the facade structure from the digital image 5, 6 to be processed.

In step S11, the structure detector 13 divides the facade 4, depicted in the digital image, along horizontal lines into horizontal layers representative of floors 41, as illustrated in FIG. 4a).

In step S12, the structure detector 13 divides the horizontal layers (i.e. floors 41) along vertical lines into tiles 42, representative in each case of an architectural building element and its surrounding wall, as illustrated in FIG. 4b).

In step S13, the structure detector 13 subdivides the tiles 42 into a hierarchy of rectangular image regions 43, as illustrated in FIG. 4c).

FIG. 3 illustrates in more detail an embodiment of step S10, executed by the structure detector 13 for detecting the facade structure from the digital image 5, 6 to be processed.

In step S101, the structure detector 13 determines similar horizontal layers, i.e. floors 41, by detecting vertical symmetry in a vertical direction.

In step S102, the structure detector 13 determines similar tiles 42 by detecting horizontal symmetry in a horizontal direction.

In probability theory and information theory, the Mutual Information (MI) of two random variables is a quantity that measures the mutual dependence of the two variables. As described in KULLBACK, S. 1959, "Information theory and statistics," John Wiley and Sons, New York, the MI quantifies the Kullback-Leibler distance between the joint distribution, P(A=a, B=b), and the product of their marginal distributions, P(A=a) and P(B=b), that is $$MI(A, B) = \sum_{a,b} P(a, b) \log \frac{P(a, b)}{P(a) \cdot P(b)}, \quad (1)$$

where A and B are two random variables. In order to utilize MI for measuring the similarity between image regions $R_1$ and $R_2$, the intensity values of the corresponding position pairs are considered. The joint and marginal intensity distributions are taken to be the normalized joint and marginal histograms of those pairs. The MI-based similarity $MI(I(R_7), I(R_2))$ measures the statistical dependence between intensities at corresponding positions in regions $R_1$ and $R_2$. Accordingly, $I(R_7)$ and $I(R_2)$ are the intensities at corresponding image locations in $R_1$ and $R_2$.

The MI is used to find similar floors and tiles in the image. In the vertical direction, translational symmetry of floors is expected, even though the bottom and top floors often differ. In the horizontal direction, floors often exhibit an ordered sequence of repeated patterns, i.e. tiles. As described below, first, the symmetry is determined in the vertical direction. Subsequently, symmetry is determined in the horizontal direction. As the approach for the horizontal direction is very similar to the one for the vertical direction, for the horizontal direction, indicated are only minor differences to the vertical approach.

$R_{y,h}$ denotes a rectangular image region with a lower left corner of (O, y) and an upper right corner of (imagewidth, y+h). For the repetition detection in the vertical direction, analyzed is the similarity between $R_{y1,h}$ and $R_{y2,h}$ for arbitrary values of $y_1$, $y_2$ and h. These three parameters span a 3D search space, which is too big to be explored completely within a reasonable processing time required for computing the MI. Thus, only adjacent regions $R_{y,h}$ and $R_{y-h,h}$ are analyzed. This is sufficient for typical facades which exhibit such contiguous, periodic tiling. The similarity between two adjacent regions with height h is computed by:

$$S(y,h)=MI(I(\mathcal{R}_{y,h}),I(\mathcal{R}_{y-h,h})). \quad (2)$$

Figure 7A:
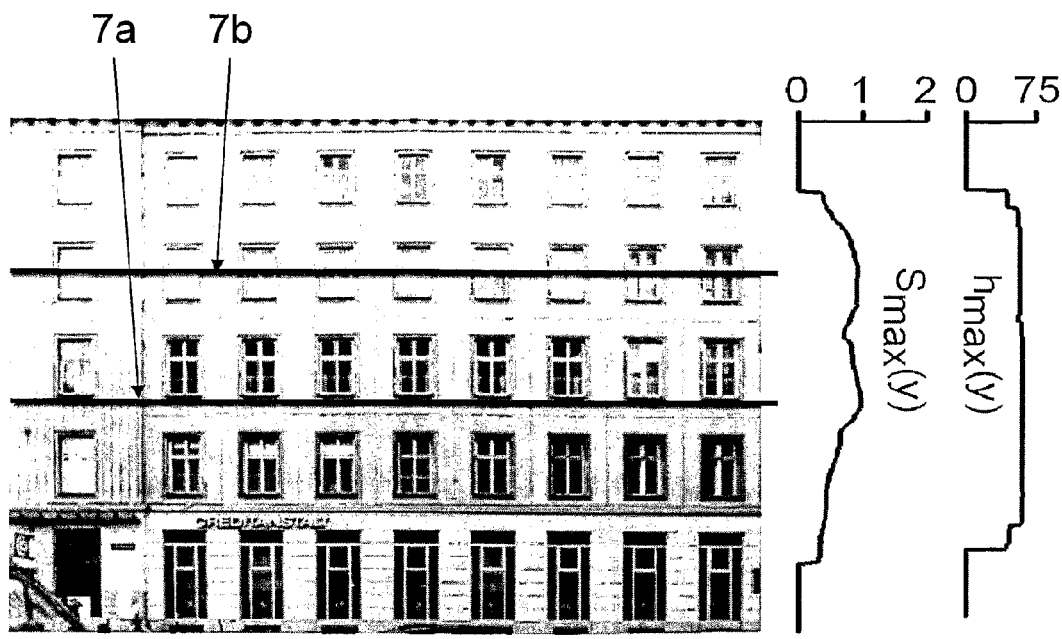
FIG. 7a: shows an example of detecting vertical symmetry of a building facade.

An exhaustive search strategy is used to compute S(y,h) for all positions y, and a range of parameters for h. The range specifies reasonable architectural floor heights, for example 3m<h<5.5 m. In the horizontal direction, there is a larger variety of tile sizes, and thus a larger range is used, for example from 0.5 m to 9 m. The search yields the best symmetry value $S_{max}(y)=\max_h S(y,h)$, for each horizontal image line and the corresponding value $h_{max}(y)=\text{argmax}_h S(y,h)$ that indicates the height resulting in the best symmetry value (see FIG. 7a). While the values for $h_{max}(y)$ are fairly constant, peaks in $S_{max}(y)$ do not correspond to natural splitting lines in the image or floor divisions for that matter. In FIG. 7a, lines 7a and 7b indicate where $s_{max}(y)$ reaches a local maximum.

Figure 7B:
FIG. 7b: shows an example of an irreducible facade after removal of the vertical symmetry of floors (left) and the horizontal symmetry of tiles (right).

In step S103, the generator 11 generates an irreducible facade structure with floors reduced to non-similar floors by stacking up similar floors, as illustrated with the pictorial representation 71 in FIG. 7b, and with tiles reduced to non-similar tiles by stacking up columns of similar tiles, as illustrated with the pictorial representation 72 in FIG. 7b.

Figure 12:
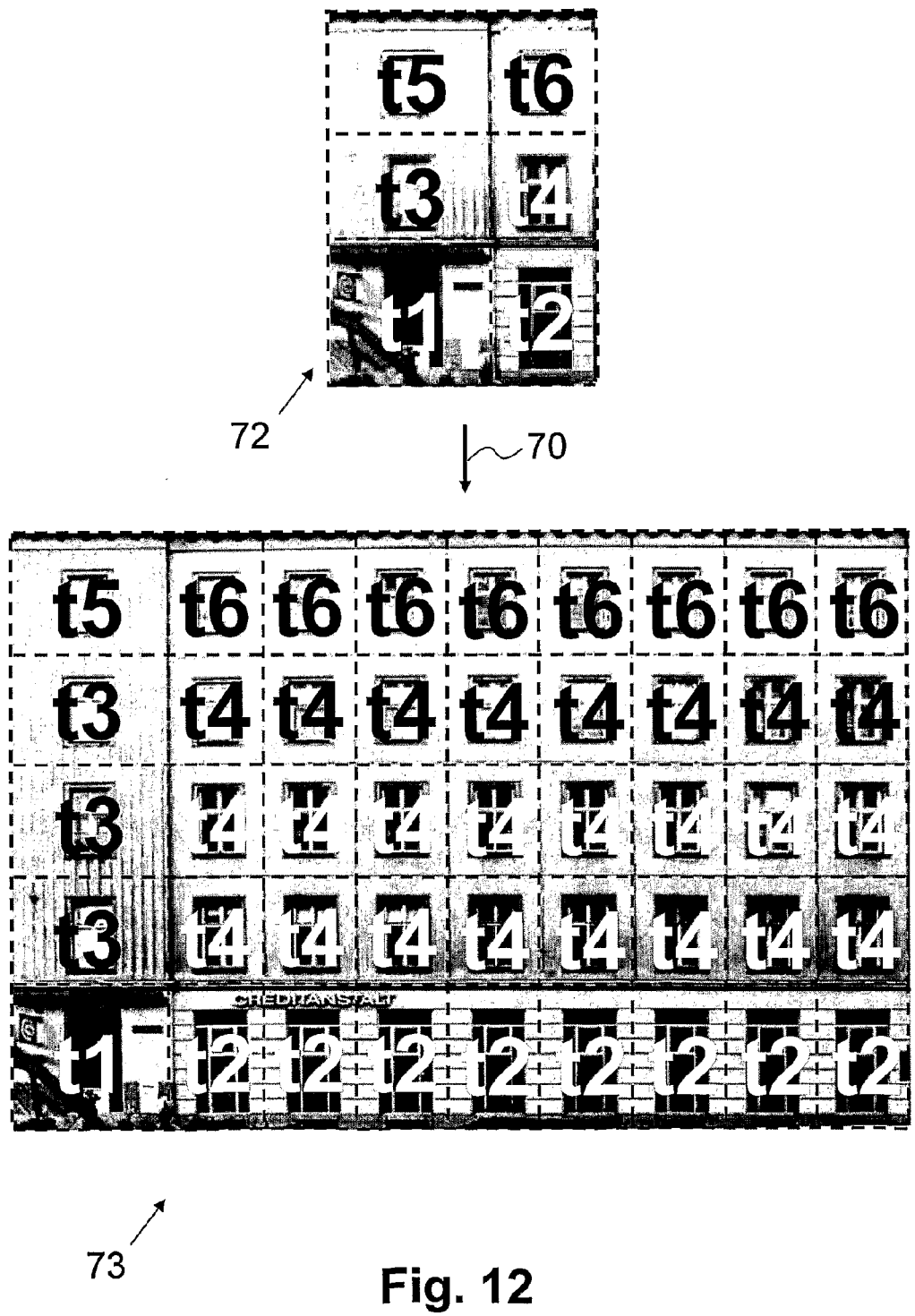
FIG. 12: shows an example of a reconstruction of a facade (bottom) from similar tiles of an irreducible facade (top).

The irreducible facade is a data structure that encodes the facade's symmetry based on the symmetry computations described above in the context of steps S101 and 102. The irreducible facade IF is a kind of collage IF(x,y) that stores a list of pixels instead of a single pixel at each location (x,y), i.e. a collage of stacks of original, similar image fragments. The irreducible facade summarizes the facade, with pixels at symmetric positions now collapsed into the stack pixel lists. The idea is that the irreducible facade exhibits no further symmetries. FIG. 7b shows on the right hand side a pictorial representation 72 of the irreducible facade for the facade shown in FIGS. 5a and 7a. If no symmetry can be detected in the original image, then the image is considered its own irreducible facade. It should be noted that the irreducible facade preserves geometric properties, e.g. lines are mapped to lines. As is illustrated in FIG. 12, by reversing in exemplary step 70 the facade "collapse" of the irreducible facade, as depicted by pictorial representation 72, which comprises clusters or "stacks" of similar tiles t1, t2, t3, t4, t5, t6, a reconstruction of the facade based on these clusters of similar tiles t1, t2, t3, t4, t5, t6 is obtained, as depicted by pictorial representation 73, First, the irreducible facade IF(x,y) is initialized to be identical to the facade image. Subsequently, the position $y=\text{argmax}(S_{max}(y))$ is selected iteratively and the image is shrunk by shifting the region $R_{y\text{-}hmax}(y),h_{max}(y)$ over the region $R_{y,hmax}(y)$. The pixels of the region positioned on top are added to the pixel list of the region positioned underneath. Preferably, indices to the original image are stored, so that the operation is reversible. A new value $S_{max}(y)$ is computed by setting it to the minimum of the two overlapping positions. This ensures stable clustering. FIG. 7b shows on the left hand side, a pictorial representation 71 illustrating the result of stacking up similar floors for the facade shown in FIGS. 5a, 7a. In the present example, the collage consists of three such floor stacks and a top cornice. Then, a similar step removes the horizontal repetitions within the floors. FIG. 7b shows on the right hand side, a pictorial representation 72 illustrating the result of stacking up similar columns of tiles for the facade shown in FIGS. 5a, 7a. Computing the irreducible facade is terminated when no more symmetry can be found, i.e. no value $S_{max}(y)$ exceeds the threshold $0.75*\tau_{max}$, $\tau_{max}$ being the best similarity score.

In step S104, the generator 11 determines in the irreducible facade structure horizontal splitting lines which divide the facade into the floors, and vertical splitting lines which divide the facade into the tiles.

When the splitting lines are computed in the irreducible facade, they are known implicitly for other symmetric elements in the facade and can be expanded into a full facade subdivision. Based on analysis of many facade images, the preferred strategy is focused on including horizontal splitting lines where vertical edges are rare and horizontal edges are dense, and including vertical splitting lines in the opposite case. The following two functions are used to signal the presence of horizontal or vertical edges:

$$hor(x,y) = \max\left\{\left(\frac{\partial I}{\partial y}\right)^2 - \alpha|\nabla I|^2, 0\right\} \quad (3)$$
$$= \max\left\{(1-\alpha)\left(\frac{\partial I}{\partial y}\right)^2 - \alpha\left(\frac{\partial I}{\partial x}\right)^2, 0\right\}$$

$$ver(x,y) = \max\left\{\left(\frac{\partial I}{\partial x}\right)^2 - \alpha|\nabla I|^2, 0\right\}$$
$$= \max\left\{(1-\alpha)\left(\frac{\partial I}{\partial x}\right)^2 - \alpha\left(\frac{\partial I}{\partial y}\right)^2, 0\right\}$$

where $$\frac{\partial I}{\partial}$$

is the partial differential operator and $$\nabla I = \left(\frac{\partial I}{\partial x}, \frac{\partial I}{\partial y}\right)$$

is the gradient operator. For example, $\alpha=0.9$.

The decision on whether to prefer a horizontal splitting line at position y, or a vertical one at position x, is made dependent on the values of two interest functions:

$$Ver(y) = \left(\sum_x ver(x,y)\right) * g_\sigma(y) - \beta\left(\sum_x hor(x,y)\right) * g_\sigma(y) \quad (4)$$
$$Hor(x) = \left(\sum_y hor(x,y)\right) * g_\sigma(x) - \beta\left(\sum_y ver(x,y)\right) * g_\sigma(x)$$

where $$g_\sigma(\cdot) = \frac{1}{2\Pi\sigma^2} e^{-\frac{|\cdot|^2}{2\sigma^2}}$$

is the Gaussian kernel and * is the (one dimensional) convolution operator.

The first and second terms encode the density of vertical and horizontal edges respectively (horizontal and vertical edges in the opposite case). β is a small constant parameter, e.g.) β=0.1; e.g. σ=1 m. High values of Ver (or Hor) will accrue in regions with strong vertical (or horizontal) edges. Based on this interest function, a set of potential positions $\{y_i\}$ (or $\{x_i\}$) is extracted for the splitting line at the local minima. If a horizontal splitting line is to be included, Ver(y) should go through a local minimum at its y position. This strongly penalizes any presence of vertical lines, and if the horizontal line is chosen, it is a locally dominant feature. Finally, an exhaustive search is employed for the optimal combination of these potential positions $\{Y_i\} \subset \{y_i\}$, the floor height being restricted to a range between 3 m and 5.5 m:

$$\{Y_i\} = \underset{\{\hat{y}_i\}}{\operatorname{argmin}} \frac{\sum_i Ver(\hat{y}_i)}{\|\{\hat{y}_i\}\|}, \text{ with } 3 < \Delta \hat{y}_i < 5.5, \{\hat{y}_i\} \subset \{y_i\} \quad (5)$$

where $\|\cdot\|$ denotes the number of elements in a set and $\Delta \hat{y}_i = \Delta \hat{y}_{i+1} - \Delta \hat{y}_i$. Similarly, the inclusion of vertical splitting lines follows from the optimization:

$$\{X_i\} = \underset{\{\hat{x}_i\}}{\operatorname{argmin}} \frac{\sum_i Hor(\hat{x}_i)}{\|\{\hat{x}_i\}\|}, \text{ with } 0.5 < \Delta \hat{x}_i < 9, \{\hat{x}_i\} \subset \{x_i\} \quad (6)$$

In step S105, the generator 11 subdivides the tiles into a hierarchy of (preferably rectangular) image regions. The image regions are determined by aligning horizontal splits within horizontal rows of tiles, and by aligning vertical splits within vertical columns of tiles, based on information about horizontal and vertical repetition of similar tiles t1, t2, t3, t4, t5, t6 included in the irreducible facade structure, as illustrated in FIG. 12.

As illustrated in FIGS. 8a-8f, the best splitting line is selected recursively in an area under consideration, e.g. tile 8. This subdivision of the structure creates a hierarchy of image regions which will subsequently be used for further analysis, such as the generation of rules for a shape grammar. In FIGS. 8a-8f, the hierarchical subdivision of the tile is indicated with white lines; each FIG. 8a-8f represents one further step of the subdivision.

Because individual tiles are noisy, used for the splitting is information about repetitions which is embedded in the irreducible facade. Thus, for subdividing the tiles, similar structures are analyzed in other tiles. The algorithm is implemented as illustrated in Table 1:

TABLE 1 initialize all tiles
while non-leaf and non-subdivided region left
   find best split candidate for each region
   synchronize splits of tiles within same group
   globally synchronize all split candidates
   subdivide regions into new regions
   mark non-subdivided regions as leafs
   mark small new regions as leafs An image region is a leaf node, if it does not split any further, or if it is smaller than a given minimum size $\tau_{size}$, for example $\tau_{size}$ is set to five pixels and may be set depending on the sharpness. For aerial imagery, this results typically in one to three splitting steps; whereas, for ground-based images (having higher resolution), there are typically one to five splits. The splitting procedure comprises two main components: (1) the selection of an optimal, local split, and (2) a global split synchronization.

Essentially, the split detection algorithm is aimed at finding relevant edges closest to the boundary of the image region to be processed (initially a tile). The algorithm evaluates all splitting lines starting from the boundary to find the first suitable edge candidate moving inward from the left side, right side, top side, and the bottom side. For example, the following seven split type choices are defined: (1) vertical dual split i.e. symmetric left and right split at once, (2) horizontal dual split, (3) left split, (4) right split, (5) top split, (6) bottom split, and (7) no split. Edges cross an entire image region.

For assessing, the relevance of an edge, its "strength" is compared against a threshold which takes into account the local noise level. This is quantified as the averaged gradient magnitude in a zone surrounding the boundary of the original tile. As the tiles boundaries are placed in wall regions, this value therefore indicates the typical edge response on walls. Edges are considered relevant only, if their averaged gradient strength surpasses this wall response multiplied by a fixed factor $\tau_{edge}$, e.g. $\tau_{edge}=4$. The first relevant edge that is identified, is taken as a candidate, resulting in a maximum of four candidates (one for each side).

In a subsequent selection step, edge intersections are avoided. Therefore, the edge-responding segments of the "surviving" edges are checked for crossing edges. There must be no transversal edge segment across an "edge responding segment" of another detected edge. As an edge comprises typically several segments, an "edge responding segment" is located over a detected edge. In other words, a newly detected edge must only cross a previously detected edge, if the crossing is not located on an edge actually detected in the image (typically, only a part of an identified split-edge can be located on an actual edge detected in the image, e.g. an upper edge of a window). Among the remaining edge segments the longest candidate is chosen. If the runner-up is parallel and has a length of at least 80% of that of the winner, both are chosen and yield a dual split. This tends to save on the number of iterations needed and helps to further increase the effectiveness of the "global" split synchronization over the whole facade image.

As the local split described above still suffers from image noise, the resulting imperfect symmetries are improved through global split synchronization by (1) comparing local solutions among a cluster of similar tiles, and (2) comparing local solutions among all tiles. To synchronize split solutions within a cluster, the most frequent split type is selected. Then the most common split type is imposed onto all members in the group. Owing to imperfections in the clustering, the split locations are aligned. Vertical splits are aligned within columns of tiles, and horizontal splits are aligned within rows of tiles. As this may still yield imperfect symmetries between these columns and rows, there is a check for such imperfect symmetries. As there is only a limited set of element sizes in each facade, all distances between parallel splitting lines are clustered globally, and cluster medians are selected as final split values. After such clustering on a per group basis, the process is repeated globally, using all the splitting lines extracted for the whole facade.

As can be seen in the Example of FIGS. 8a-8f, in the initial tile 8, shown in FIG. 8a, a first a lower image area 81 is split off, as illustrated in FIG. 8b. A further split separates image area 82 from the lower side of the window sill, as illustrated in FIG. 8c. As illustrated in FIG. 8d, two vertical image segments 83, 84 are divided off, on the left and right hand sides of the window frame. Two horizontal image areas 85, 86 are separated off the top and bottom of the window, as shown in FIG. 8e. And the vertical image areas 87, 88 are separated off the window in FIG. 8f.

In step S2, the element detector 12 determines from the architectural element library 3D architectural objects which match the image regions 43, 81-88 determined in step S1.

In step S21, the element detector 12 determines 2D representations for the 3D architectural objects included in the architectural element library 14. The 2D representations are retrieved from the library 14 or generated at run-time.

In step S22, the element detector 12 determines clusters of similar image regions, and determines in each case the 2D representation having the best match with the image regions of a cluster. Preferably, the clusters of similar regions are determined previously with the hierarchical subdivision of the facade image, which provided rectangular image regions clustered into groups of similar regions.

Based on the 2D representations $p\{e_i\}$ of the 3D architectural objects $\{e_i\}$ in the library 14, the region type $T(R)$ is computer for each rectangular image region:

$$T(\mathcal{R}) = \mathrm{argmax}_i \, MI(I(p(e_i)), I(\mathcal{R})). \tag{7}$$

Although equation (7) is direct and efficient, it may yield some mismatches owing to noise and different appearances of the same element. However, the clustering information in the irreducible facade provides the additional constraint that elements in the same cluster should belong to the same type. Thus, an element type is determined for each cluster C as follows:

$$T(C) = \mathrm{argmax}_i \sum_{\mathcal{R} \in C} MI(I(p(e_i)), I(\mathcal{R})). \tag{8}$$

Thereby, the best-fitting element per cluster C is selected.

Figure 5B:
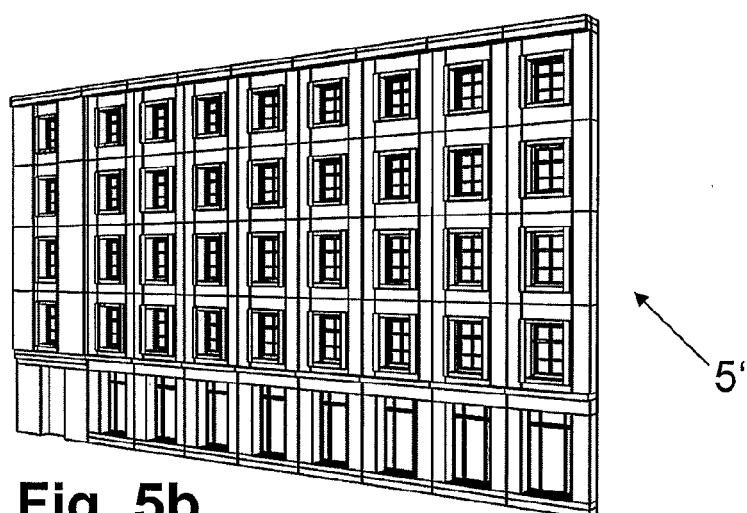
FIG. 5b: shows an example of a 3D geometric model of the building facade in a polygonal form.
Figure 5C:
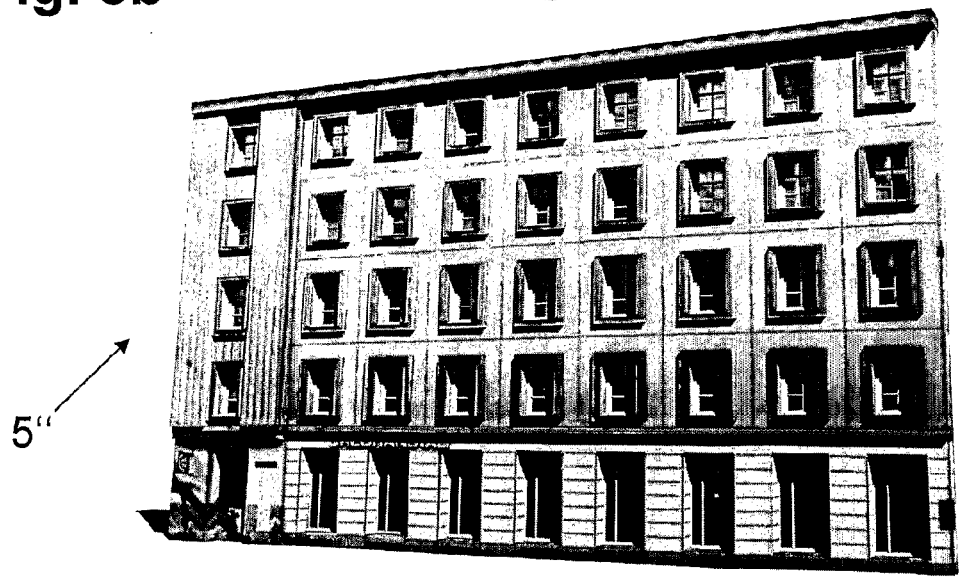
FIG. 5c: shows an example of a 3D geometric model of the building facade including shadows and reflections enabled by semantic information.
Figure 6B:
FIG. 6b: shows an example of a 3D geometric model of the facade section including shadows and reflections enabled by semantic information.

In step S3, the generator 11 generates the 3D geometric model 44, illustrated schematically in FIG. 4*d*), based on the 3D architectural objects 45 determined in step S2. Specifically, the generator 11 generates the 3D geometric model 44 based on the facade structure, defined by floors 41 and tiles 42, the hierarchy of image regions 43, and the 3D architectural objects 45. FIGS. 5*c* and 6*b* illustrate examples of 3D geometric models 5" and 6", generated for the examples of facade images 5 or 6, respectively, shown in FIGS. 5*a* and 6*a*. FIG. 5*b* shows an example of a generated 3D geometric model 5' in a polygonal form.

Depending on the application, the generator 11 stores the 3D geometric model in data store 15, shows the 3D geometric model as a visual output 17 on display 16, or produces a print output 18 on printer 10.

Alternatively or in addition, in step S3', the generator 11 generates a definition of the 3D geometric model, based on the 3D architectural objects. Specifically, the generator 11 generates the definition of the 3D geometric model based on the facade structure, the hierarchy of image regions 43, and the 3D architectural objects. Preferably, a data structure of the definition is stored in data store 15. Depending on the embodiment, the generator 11 generates in step S3 the 3D geometric model based on the definition of the 3D geometric model, generated in step S3'.

Preferably, the generator 11 generates the 3D geometric model or the definition of the 3D geometric model by considering shader information associated with the 3D architectural objects, thereby rendering shadows and reflections in the 3D geometric model and/or definition thereof. Furthermore, the intensities that are also kept in the irreducible facade, are used by the generator 11 for back projection of the original textures.

Preferably, the resulting facade interpretation is encoded as a shape tree including the determined architectural elements. Depth information for the facade elements is set automatically based on default values stored for the architectural elements, or through simple editing operations, e.g. user can select clusters of elements and adjust their depth interactively. The depth information is stored in the shape tree.

In a next step, the computed subdivision (i.e. the shape tree) is encoded as shape grammar rules, described, for example, in BEKINS, D., AND ALIAGA, D. 2005, "Build-by-number: Rearranging the real world to visualize novel architectural spaces," in IEEE Visualization. The generated rules contain the hierarchical information and correct dimensions. In addition, the repetition of tiles is encoded based on the similarity information. For example, the rule set for the facade is encoded as CGA Shape, described, for example, in MÜLLER, P., WONKA, P., HAEGLER, S., ULMER, A., AND VAN GOOL, L. 2006, "Procedural Modeling of Buildings," in Proceedings of ACM SIGGRAPH 2006/ACM Transactions on Graphics, ACM Press, New York, N.Y., USA, vol. 25, 614-623. For example, the rules for the facade structure (i.e. floors and tiles) are encoded as combination of subdivision and repeat split as illustrated in Table 2:

TABLE 2

| | |
|---|---|
| 1: | facade → Subdiv(Y,5.4,lr,3.9,0.6) {floor1 \| Repeat(Y,4) {floor2} \| floor3 \| top} |
| 2: | floor1 → Subdiv(X,5.3,lr) {tile1 \| Repeat(X,3.1) {tile2} } |
| 3: | floor2 → Subdiv(X,5.3,lr) {tile3 \| Repeat(X,3.1) {tile4} } |
| ... | |

Figure 10:
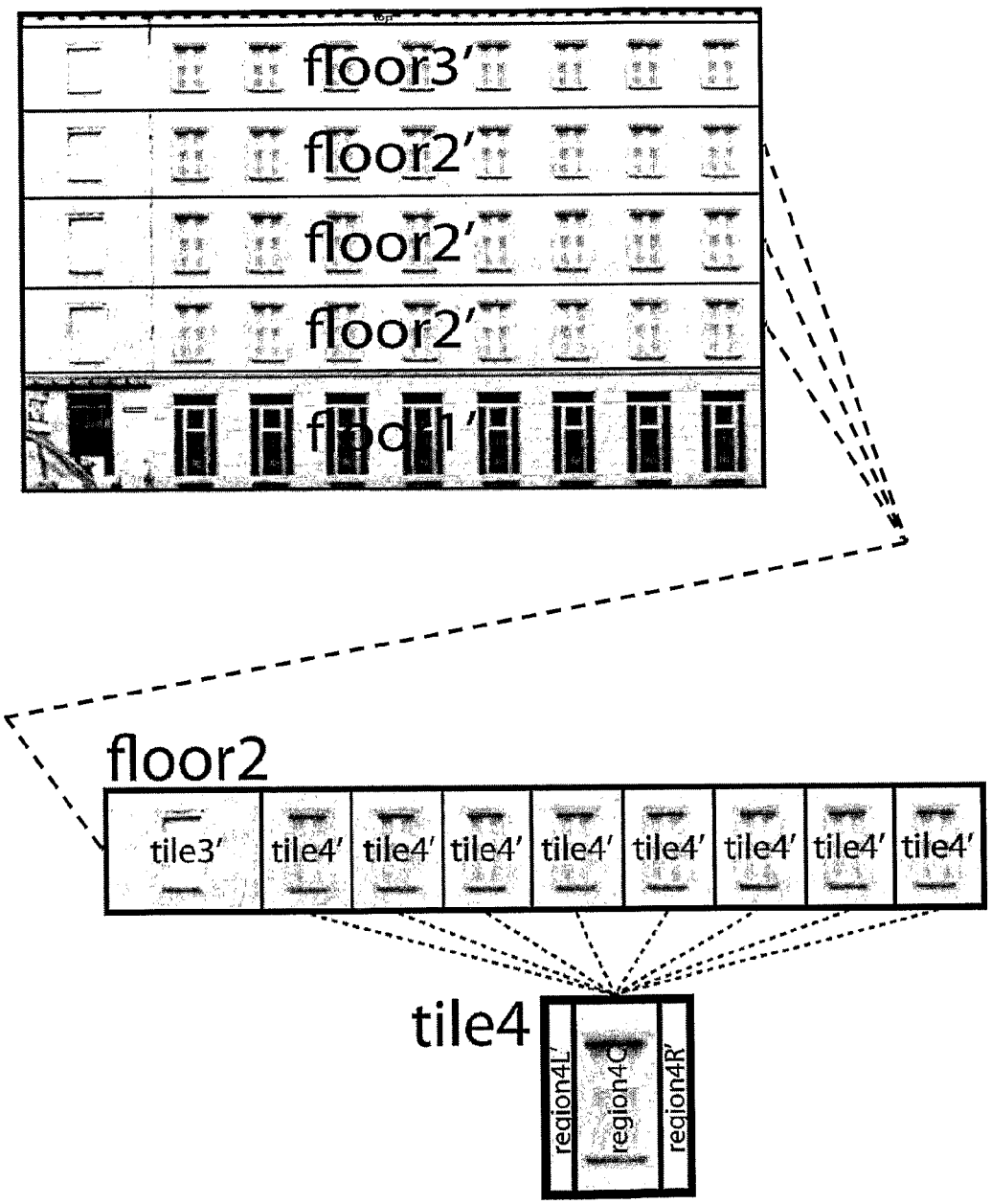
FIG. 10: illustrates a grammar rule set including a rule for subdividing a building facade into floors, subdividing a middle floor into tiles, and subdividing a tile into image areas.

Rule 1 splits the facade into floors and the other rules split each floor into tiles. Rules 1 and 3 are illustrated in FIG. 10. The dimensions of the subdivision split operation Subdiv for non-repetitive shapes are in absolute values and the others in relative values according to their relative size. Owing to the nature of CGA Shape, this ensures that the resulting rule set is size-independent and can later be used in a flexible way. If there are repeating elements (in either horizontal or vertical direction), the dimensions of the first and last shape of the split are in absolute values, the others in relative values. Table 3 illustrates an example of rules which encode the tiles:

TABLE 3

| | |
|---|---|
| 6: | tile1 → Subdiv(X,lr,0.3) {region1B \| region1T} |
| ... | |
| 9: | tile4 → Subdiv(X,lr,1.9,lr){region4L \| region4C \| region4R} |
| ... | |

If there is a non-dual split type, as in rule 6, the subdivision split divides the tile into two shapes. It should be noted that the dimension of the smaller shape is encoded as absolute value, while the bigger shape has 'floating' dimensions, i.e. given as relative value. For dual splits, as in rule 9, the outer regions are made floating and the center region has absolute size, for example. The split dimensions of multiple defined shapes are computed by averaging the split positions. Therefore, the split synchronization ensures the same hierarchy of split types within the same group (the texture can be averaged accordingly). As shown in Table 4, the splitting at the image region levels is encoded in a similar way:

TABLE 4

| | |
|---|---|
| 14: | region1B → Subdiv(X,lr,0.3) {region1BB \| region1BT} |
| 15: | region1T → Subdiv(lr,lr,0.2) T(0,0,−0.2) I(wall) |
| ... | |

Figure 11A:
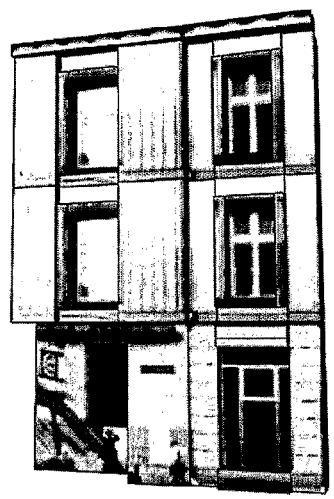
FIGS. 11a-11c: illustrate the reconstruction of a 3D geometric model based on an extracted rule set.
Figure 11B:
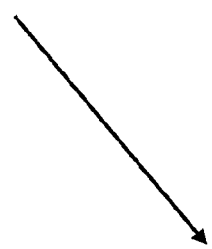
Figure 11B:
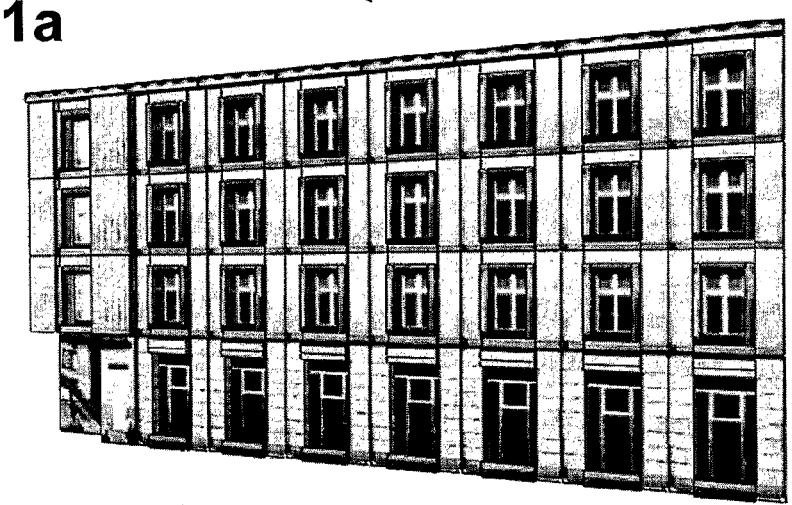
Figure 11B:
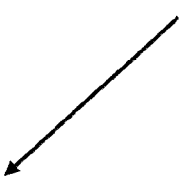
Figure 11C:
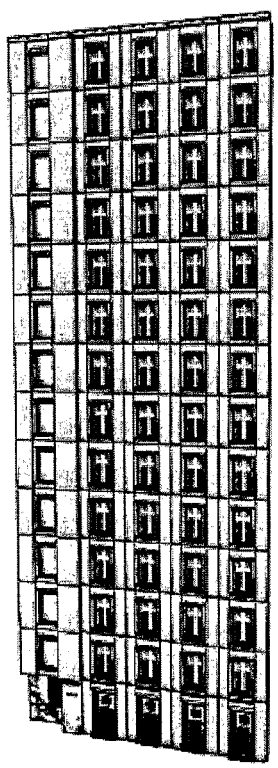

Once a leaf shape is reached, as in rule 15, the depth of the scope is set, translated accordingly, and a 3D architectural object from the library 15, e.g. a wall shape (cube), is inserted. Finally, there is a complete rule set that describes the segmented facade. The rule set is size-independent and can be applied to differently dimensioned facades, as illustrated in FIGS. 11a-11c. Moreover, it is possible to include parts of the rule set in other building designs via copy-paste. It should be noted here, that it is also possible to perform the shape tree to rule set conversion in a depth-first fashion instead of the width-first fashion, as described above.

For example, in an implementation in C++ running on a Intel Pentium D 3.4 GHz with 2 Gb RAM and Linux as operating system, the typical processing time for detecting the facade structure is a couple of minutes, for example for a 1600×1200 image, the average processing time is three minutes. The typical processing time for subdividing tiles and determining matching 3D architectural objects from the library 15 is between 30 and 90 seconds, the subdividing of the tiles using about 90% of the processing time.

It should be noted that, in the description, the computer program code has been associated with specific functional modules and the sequence of the steps has been presented in a specific order, one skilled in the art will understand, however, that the computer program code may be structured differently and that the order of at least some of the steps could be altered, without deviating from the scope of the invention.

The invention claimed is:

1. A system for generating a 3D (three dimensional) geometric model and/or a definition of the 3D geometric model from a digital image of a building facade, the system comprising:
a computer system comprising one or more processors, said computer system programmed to implement at least:
a structure detector configured to:
rectify a digital image of a building facade using at least a Hough linear transformation;
subdivide the digital image into image regions;
determine similar horizontal layers by detecting vertical symmetry in a vertical direction;
determine similar vertical columns by detecting horizontal symmetry in a horizontal direction;
generate an irreducible facade structure with horizontal layers reduced to non-similar horizontal layers by stacking up the similar horizontal layers, and with columns reduced to non-similar columns by stacking up the similar columns;
determine in the irreducible facade structure horizontal splitting lines which divide the facade into floors, and vertical splitting lines which divide the facade into tiles;
subdivide the tiles into a hierarchy of rectangular image regions by aligning horizontal splits within horizontal rows of tiles, and aligning vertical splits within vertical columns of tiles, based on information about horizontal and vertical repetition of similar tiles included in the irreducible facade structure, wherein subdividing the tiles uses a recursive process of selecting a best splitting line for each of a plurality of image regions, the recursive process comprising initializing all tiles, selecting a best split candidate for each region, synchronizing splits of tiles within a same group, globally synchronizing all split candidates, subdividing the regions into new smaller regions, and recursively repeating the recursive process until no non-subdivided regions remain;
an architectural element library comprising 3D architectural objects;
an element detector configured to determine in the architectural element library 3D architectural objects corresponding to the image regions; and
a generator configured to generate, without requiring user input, the 3D geometric model or the definition of the 3D geometric model based on the 3D architectural objects determined.

2. The system of claim 1, wherein the structure detector is configured to detect a facade structure from the digital image by dividing the facade along horizontal lines into horizontal layers representative of floors, and by dividing the horizontal layers along vertical lines into tiles representative in each case of an architectural building element and its surrounding wall, and to subdivide the tiles into a hierarchy of rectangular image regions; and
the generator is configured to generate the 3D geometric model or the definition of the 3D geometric model based on the facade structure, the hierarchy and the 3D architectural objects.

3. The system of claim 1, wherein the element detector is configured to determine the 3D architectural objects by determining a 2D representation of the 3D architectural objects included in the architectural element library, determining clusters of similar image regions, and determining in each case the 2D representation having a best match with the image regions of a cluster.

4. The system of claim 1, wherein the generator is further configured to generate the 3D geometric model or the definition of the 3D geometric model based on shader information associated with the 3D architectural objects.

5. A computer-implemented method of generating a 3D geometric model and/or a definition of the 3D geometric model from a digital image of a building facade, the method comprising:
rectifying a digital image of a building facade using at least a Hough linear transformation;
subdividing the digital image into image regions:
wherein subdividing the digital image into image regions comprises detecting a facade structure from the digital image by dividing the facade along horizontal lines into horizontal layers representative of floors, and by dividing the horizontal layers along vertical lines into tiles representative in each case of an architectural building element and its surrounding wall, and subdividing the tiles into a hierarchy of rectangular image regions by using a recursive process of selecting a best splitting line for each of a plurality of image regions, the recursive process comprising initializing all tiles, selecting a best split candidate for each region, synchronizing splits of tiles within a same group, globally synchronizing all split candidates, subdividing the regions into new smaller regions, and recursively repeating the recursive process until no non-subdivided regions remain, and generating the 3D geometric model or the definition of the 3D geometric model based on the facade structure, the hierarchy and the 3D architectural objects;
wherein detecting the facade structure further comprises determining similar horizontal layers by detecting vertical symmetry in a vertical direction, determining similar vertical columns by detecting horizontal symmetry in a horizontal direction, generating an irreducible facade structure with horizontal layers reduced to non-similar horizontal layers by stacking up the similar horizontal layers, and with columns reduced to non-similar columns by stacking up the similar columns, and determining in the irreducible facade structure horizontal splitting lines which divide the facade into the floors, and vertical splitting lines which divide the facade into the tiles; and wherein subdividing the tiles into the hierarchy of rectangular image regions includes aligning horizontal splits within horizontal rows of tiles, and aligning vertical splits within vertical columns of tiles, based on information about horizontal and vertical repetition of similar tiles included in the irreducible facade structure;

determining in an architectural element library 3D architectural objects corresponding to the image regions; and generating the 3D geometric model or the definition of the 3D geometric model based on the 3D architectural objects determined;

wherein the method is performed by computer hardware, including one or more computer processors, without human intervention.

6. The method of claim 5, wherein determining the 3D architectural objects comprises determining a 2D representation of the 3D architectural objects included in the architectural element library, determining clusters of similar image regions, and determining in each case the 2D representation having a best match with the image regions of a cluster.

7. The method of claim 5, wherein generating the 3D geometric model or the definition of the 3D geometric model is further based on shader information associated with the 3D architectural objects.

* * * * *